US008666642B2

(12) United States Patent
Stempnik et al.

(10) Patent No.: US 8,666,642 B2
(45) Date of Patent: Mar. 4, 2014

(54) MEMORY CORRUPTION DETECTION IN ENGINE CONTROL SYSTEMS

(75) Inventors: Joseph M. Stempnik, Warren, MI (US); James A. Shore, Wixom, MI (US); Bryan D Lehman, Fenton, MI (US)

(73) Assignee: GM Global Technology Operations LLC

( * ) Notice: Subject to any disclaimer, the term of this patent is extended or adjusted under 35 U.S.C. 154(b) by 784 days.

(21) Appl. No.: 12/840,654

(22) Filed: Jul. 21, 2010

(65) Prior Publication Data

US 2011/0196597 A1 Aug. 11, 2011

Related U.S. Application Data (60) Provisional application No. 61/303,084, filed on Feb. 10, 2010.

(51) Int. Cl.
*G01R 31/3177* (2006.01)
*G01M 15/04* (2006.01)

(52) U.S. Cl.
USPC ...... 701/115; 701/114; 123/406.13; 123/479; 73/114.61; 714/724

(58) Field of Classification Search
USPC ............. 701/102, 114, 115; 123/406.13, 479; 123/480; 714/724, E11.055, E11.056
See application file for complete search history.

(56) References Cited

U.S. PATENT DOCUMENTS

| 4,402,057 A * | 8/1983 | Itou et al. ........................ 714/22 |
| RE31,582 E * | 5/1984 | Hosaka et al. ................ 701/102 |
| 4,888,686 A * | 12/1989 | Sinz et al. ..................... 711/162 |
| 5,758,054 A * | 5/1998 | Katz et al. ....................... 714/22 |
| 5,884,211 A * | 3/1999 | Pauli et al. .................... 701/115 |
| 5,964,811 A * | 10/1999 | Ishii et al. .................... 701/29.2 |
| 7,743,295 B2 * | 6/2010 | Mayer et al. .................. 714/724 |
| 7,890,245 B2 * | 2/2011 | Breitbach et al. ............. 701/114 |
| 2010/0004842 A1 * | 1/2010 | Breitbach et al. ............. 701/102 |

FOREIGN PATENT DOCUMENTS

| JP | 9292312 | 11/1997 |
| JP | 2006-243898 | 9/2006 |

* cited by examiner

*Primary Examiner* — Erick Solis (57) ABSTRACT

A system for detecting memory corruption in an engine control module includes a variable selection module, an output module, an input module, and a response comparing module. The variable selection module selects a variable of a control system for testing. The output module outputs a predetermined value of said variable to a memory location where said variable is stored in said engine control module. The input module receives a response of said control system to said predetermined value when said predetermined value is written in said memory location. The response comparing module compares said response to a predetermined range and determines that said memory location is defective when said response is not within said predetermined range.

16 Claims, 6 Drawing Sheets

MEMORY CORRUPTION DETECTION IN ENGINE CONTROL SYSTEMS

CROSS-REFERENCE TO RELATED APPLICATIONS

This application claims the benefit of U.S. Provisional Application No. 61/303,084, filed on Feb. 10, 2010. The disclosure of the above application is incorporated herein by reference in its entirety.

FIELD

The present disclosure relates generally to diagnostic systems of vehicles and particularly to systems and methods for detecting corruption of memory used in control systems of vehicles.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Figure 1:
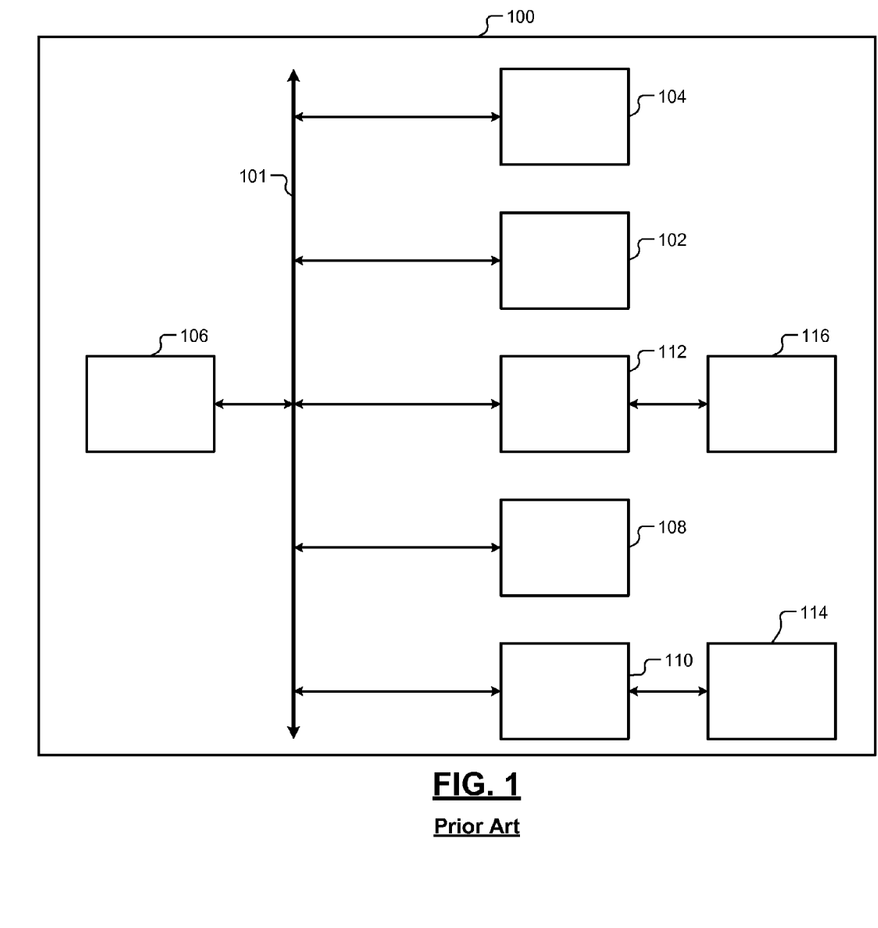
FIG. 1 is a functional block diagram of a vehicle control system according to the prior art.

Referring now to FIG. 1, a vehicle control system 100 may comprise an engine 102, a driver input module 104, and an engine control module (ECM) 106 that controls the engine 102 and a plurality of control systems. For example only, the control systems may include a throttle control system 108, a brake control system 110, and a transmission control system 112. The vehicle control system 100 may comprise additional control systems. The ECM 106 communicates with the engine 102, the driver input module 104, and the plurality of control systems via a cable assembly (wire harness) 101.

The control systems operate according to driver inputs sensed by the driver input module 104 and control signals received from the ECM 106. Each control system may comprise one or more sensors that sense operating parameters of components (hereinafter variables) controlled by the control system. The ECM 106 may receive signals indicating values of the variables. The ECM 106 may comprise calibrated values for one or more of the variables. Based on the values sensed by the sensors, the calibrated values, and/or the driver inputs, the ECM 106 may generate control signals to control operations of the control systems.

For example, the throttle control system 108 may control throttle (not shown) based on inputs received from a driver via the driver input module 104 and control signals received from the ECM 106. For example, the throttle control system 108 may control the throttle based on a position of an accelerator pedal (not shown) sensed by the driver input module 104. The control signals received from the ECM 106 may include a value of a variable called throttle position corresponding to the position of the accelerator pedal. The throttle control system 108 may control the throttle based on the value of the variable throttle position.

The brake control system 110 may control brakes 114 based on inputs received from the driver via the driver input module 104 and control signals received from the ECM 106. For example, the brake control system 110 may control the brakes 114 based on a position of a brake pedal (not shown) sensed by the driver input module 104. The control signals received from the ECM 106 may include a value of a variable called braking force corresponding to the position of the brake pedal. The brake control system 110 may control the brakes 114 based on the value of the variable braking force.

The transmission control system 112 may control a transmission 116 based on inputs received from the driver via the driver input module 104 and control signals received from the ECM 106. For example, the transmission control system 112 may control the transmission 116 based on positions of the accelerator pedal, the brake pedal, and/or a clutch pedal (not shown) sensed by the driver input module 104. Additionally, the transmission control system 112 may control the transmission 116 based on road conditions (e.g., gradient) sensed by other control systems. The control signals received from the ECM 106 may include a value of a variable called upshift (or downshift) corresponding to the driver inputs and/or the road conditions. The transmission control system 112 may control the transmission 116 based on the value of the variable upshift (or downshift).

SUMMARY

A system for detecting memory corruption in an engine control module comprises a variable selection module, an output module, an input module, and a response comparing module. The variable selection module selects a variable of a control system for testing. The output module outputs a predetermined value of the variable to a memory location where the variable is stored in the engine control module. The input module receives a response of the control system to the predetermined value when the predetermined value is written in the memory location. The response comparing module compares the response to a predetermined range and determines that the memory location is defective when the response is not within the predetermined range.

In another feature, the system further comprises a test value generation module that generates the predetermined value, wherein the predetermined value includes one of a maximum value, a minimum value, and a median value of the variable.

In other features, the system further comprises a copy and store module that copies data stored in the memory location before the predetermined value is written in the memory location and that stores the data. The system further comprises a restoring module that outputs the data to the memory location after the comparing module compares the response to the predetermined range.

In still other features, the system comprises a write module, and an operation sensing module. The write module writes a predetermined value of a variable in a memory location where values for the variable are stored in the engine control module. The values are used by a control system to control a vehicle operation. The operation sensing module senses a response of the control system to the predetermined value. The system determines that a failure occurred when the response is not within a predetermined range.

In another feature, the predetermined value includes one of a maximum value, a minimum value, and a median value for the variable.

In other features, the system further comprises a fault identification module that identifies when the engine control module did not properly respond to the corrupted value. The fault identification module records the name of the variable that failed and the reason for the failure.

In still other features, the systems and methods described above are implemented by a computer program executed by one or more processors. The computer program can reside on a tangible computer readable medium such as but not limited to memory, nonvolatile data storage, and/or other suitable tangible storage mediums.

Further areas of applicability of the present disclosure will become apparent from the detailed description provided hereinafter. It should be understood that the detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

In vehicle control systems, failure modes and effects analysis (FMEA) and fault tree analysis (FTA) are typically used to identify variables that may cause potential safety hazards. Identifying the variables, determining effects of failures on vehicle operation, and selecting actions to mitigate the failures, however, can be difficult and time consuming.

Engine control modules of the vehicle control systems typically comprise fault identification systems that can identify failures. For example, a memory location that stores a value of a variable may be defective. Consequently, the value of the variable written in the memory location may be corrupted and may be different than a desired value of the variable. For example, a value of throttle position written in a memory location may not correspond to a desired value that correctly reflects a sensed position of the accelerator and/or brake pedal. The fault identification systems will detect that the value written in the memory location is incorrect for the sensed position of the accelerator and/or brake pedal. Accordingly, the value written in the memory location will not be used to control throttle position.

Occasionally, however, the fault identification systems may fail. If the fault identification systems are not functioning correctly, the value written in the memory location may not be found inconsistent and may be used, thereby producing an undesired engine operation. For example, the value of the throttle position written in the memory location may erroneously indicate that the throttle should be fully opened when the accelerator pedal is not pressed at all. If the inconsistency between the value and the position is not detected, the vehicle will accelerate when acceleration is not intended.

The present disclosure relates to a corruption detection system that identifies defective memory locations and that allows technicians to mitigate hazards before they occur. Preferably, the corruption detection system identifies variables that can cause a control system of a vehicle to shut down or that may cause vehicles to accelerate without any driver input. The corruption detection system allows technicians to test each variable in a control system. Each variable is assigned multiple values, and vehicle response to each value is determined. The values selected are inconsistent with current operation of the vehicle. For example only, the values may include a maximum value, a minimum value, and a median value of the variable.

The values are written to the memory location where the variable is stored. Normally, the fault identification systems may detect that the values are inconsistent with the current operation of the vehicle, and the values will not be used by the corresponding control system. For example, when a high value for throttle position is written to the memory location while the accelerator pedal is not pressed, the fault identification systems will detect the inconsistency between the high value of the variable and the position of the accelerator pedal if the memory location is not defective. Accordingly, the high value will be ignored, and the vehicle response to the high value will be within a predetermined range of the current operation.

If, however, the memory location is defective, the fault identification systems may not detect the inconsistency, and the vehicle response to the high value may not be within the predetermined range. When the corruption detection system detects that the vehicle response to the high value is not within the predetermined range, the memory location is declared defective.

Throughout the present disclosure, deliberately writing an incorrect value of a variable (i.e., a value that is inconsistent with current operating conditions, driver inputs, etc.) to a memory location in a control system is called corrupting the variable or corrupting the memory location. The corruption detection system may corrupt each memory location in an engine control module (ECM). In some implementations, the corruption detection system may corrupt a single memory location or a group of memory locations that store a variable corresponding to an interface of a control system. The number of memory locations may depend on the size of the variable (e.g., a nibble (i.e., 4 bits), a byte (i.e., 8 bits), a word (16 or 32 bits), and so on). Alternatively, the corruption detection system may corrupt values of a plurality of variables in a ring or a combination of rings, where a ring is a set of components in one or more control systems.

In general, the corruption detection system may include the following functions. The corruption detection system can automatically corrupt values of variables in memory locations. After determining effects of corrupting, the corruption detection system may restore original values of the variables in the memory locations. Alternatively, the corruption detection system allows technicians to select one variable to corrupt at a time. The corruption detection system allows technicians to cycle through a subset of variables by initializing the corruption detection system. The corruption detection system allows technicians to cycle through all variables by initializing the corruption detection system. The corruption detection system records for further analysis names of the variable, fail criteria, and the value or values of the variables that caused failure. The corruption detection system allows the technicians to determine the amount of time between failures and the duration of each failure. The corruption detection system allows the control systems to initialize without user intervention after failure.

Additional functions including corrupting memory locations that store control programs (code) are contemplated. For example only, the control programs may include programs used by the fault identification systems, code used by different control systems, and so on. Thus, the corruption detection system enhances understanding about how a vehicle may react when any memory location in the software code is corrupted with incorrect values.

Figure 2:
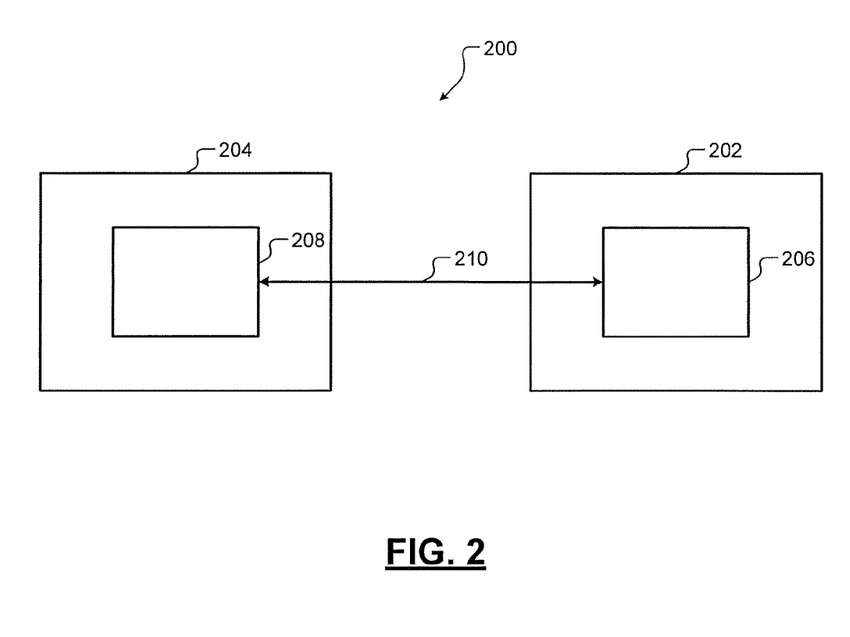
FIG. 2 is a functional block diagram of a system for corruption testing of memory according to the present disclosure.

Referring now to FIG. 2, a system 200 for corruption testing of memory according to the present disclosure is shown. The system 200 comprises a vehicle control system 202 and a portable computing device 204. The vehicle control system 202 comprises an ECM 206. The portable computing device 204 comprises a corruption testing module 208. The corruption testing module 208 performs corruption testing of memory used by the ECM 206 according to the present disclosure as described below.

The portable computing device 204 may include a laptop computer or any handheld computing device. The portable computing device 204 may communicate with the vehicle control system 202 via a communication link 210. The communication link 210 may include a wireline communication link or a wireless communication link. The corruption testing module 208 may be implemented as a software program, firmware, or by a combination of a software program, firmware, and hardware. Although not shown, in some implementations, the corruption testing module 208 may be integrated entirely or partially in the ECM 206. Alternatively or additionally, some modules of the ECM 206 may be implemented in the corruption testing module 208.

In use, the corruption testing module 208 may generate a graphical user interface (GUI) on a display (not shown) of the portable computing device 204. The GUI may allow a technician to select a variable or a set of variables (e.g., one or more rings defined above) to test. Alternatively, the technician may select variables of a control system or variables of a subsystem of a control system to test. Depending on the variables selected, the corruption testing module 208 may test the memory locations where the selected variables are stored.

Typically, the technician may use the GUI to provide one or more values for a variable to corrupt the memory location where the variable is stored. The values may include maximum, minimum, and median values of the variable. Alternatively, the corruption testing module 208 may automatically generate and provide these values when the technician selects the variables to test. These values are output one at a time, separated by predetermined or selectable time intervals. Depending on the variable tested, some values may take longer than others to generate a response in a control system. Accordingly, the technician or the corruption testing module 208 may output these values separated by sufficient time to allow each value to generate a response.

The ECM 206 receives these values via the communication link 210. The ECM writes these values into the memory locations where the variables are typically stored. The ECM comprises a fault identification module (discussed below) that determines whether the value of the variable written in the memory location corresponds to the current operating condition of a component controlled by the variable. If not, the value is not output to the control system that controls the component. When the memory location is defective, however, the fault identification module may output the value to the control system that controls the component. The control system may control the component according to the value and generate a corresponding response.

The ECM 206 transmits the response to the corruption testing module 208 via the communication link 210. The corruption testing module 208 determines if the response is within a predetermined range. The predetermined range may be selected based on safety guidelines. For example, the predetermined range may be based on variations in the response that can result when the values of the variables are within 80% to 99% of their calibrated values. When the response is within the predetermined range, the memory location is declared to be functioning correctly. Otherwise, the memory location is declared defective.

Additionally, the corruption testing module 208 records other data for further analysis. For example, the corruption testing module 208 analyzes the response to determine if the variable caused a running rest, exceeded the predetermined threshold, and/or recorded a processor fault. The corruption testing module 208 records data that an engineer can review to identify failures that were undetected and can prepare a report based on the data. The report can be used to mitigate effects of corruption of safety-critical variables.

Figure 3:
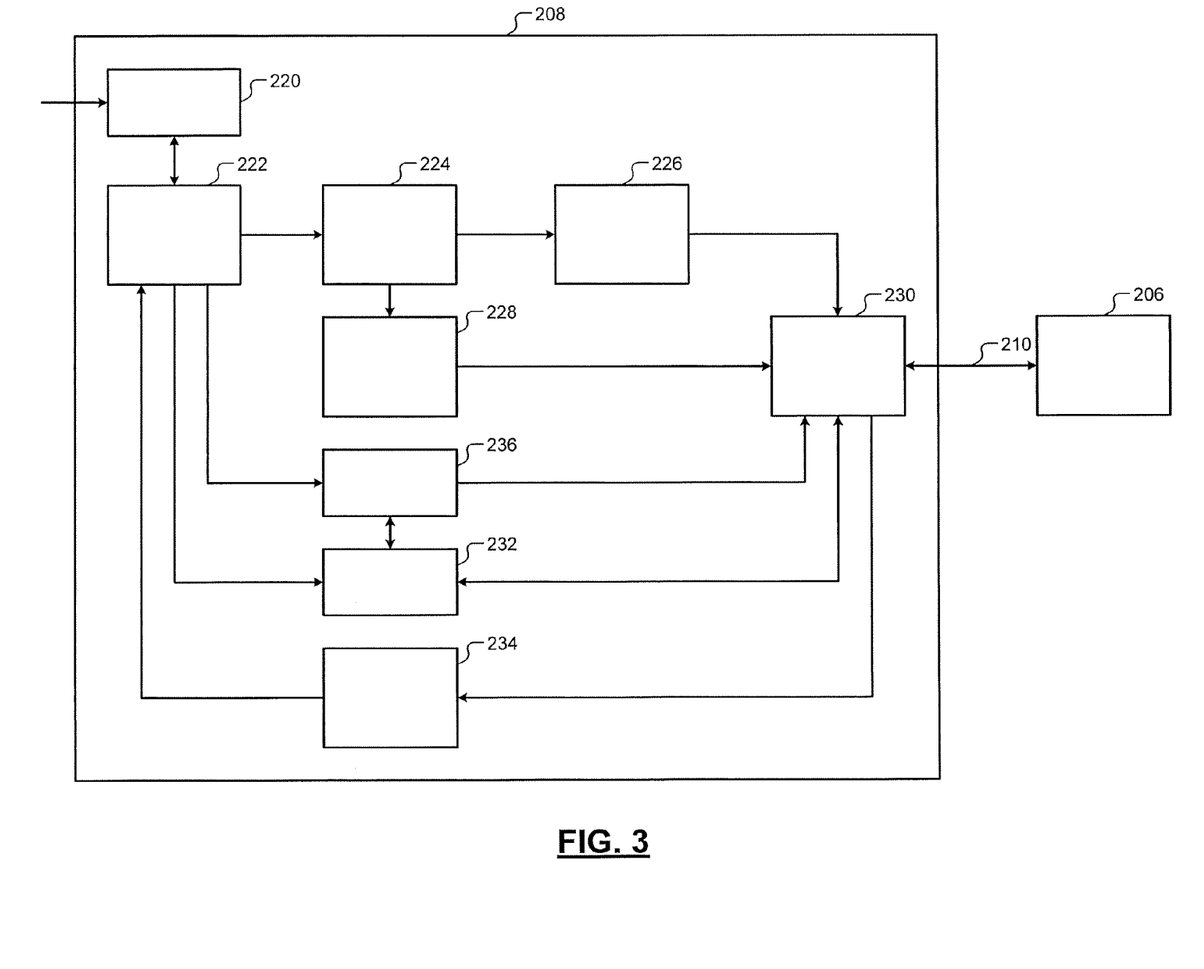
FIG. 3 is a functional block diagram of a corruption testing module according to the present disclosure.

Referring now to FIG. 3, the corruption testing module 208 is shown in detail. The corruption testing module 208 may comprise an input module 220, a control module 222, a variable selection module 224, an address selection module 226, a test value generation module 228, an input/output (I/O) module 230, a copy and store module 232, a response comparing module 234, and a restoring module 236.

The technician uses the input module 220 to initialize the corruption testing module 208. The control module 222 may be configured to automatically begin testing a set of variables on initialization. When the control module 222 begins testing automatically, the variable selection module 224 selects variables to be tested. For example, the variable selection module 224 may select variables of one control system, one subsystem, and so on. Alternatively, the variable selection module 224 may select variables of a plurality of control systems or subsystems. The test value generation module 228 generates values (e.g., maximum, minimum, and median values) for each selected variable. Alternatively, the control module 222 may generate the GUI on a display of the input module 220. The technician may select the variables and/or the values using the GUI.

Based on the variables selected, the address selection module 226 selects the addresses of memory locations where the selected variables are stored in memory in the ECM 206. The I/O module 230 outputs the addresses and the values of the selected variables to the ECM 206 via the communication link 210.

Before writing the values received form the corruption testing module 208 in the memory locations, the ECM 206 may transmit current values of the selected variables stored in the memory locations to the corruption testing module 208. The copy and store module 232 of the corruption testing module 208 may store the current values of the selected variables received from the ECM 206. The restoring module 236 may restore the current values when testing of the selected variables is completed. The restoring module 236 may retrieve the current values from the copy and store module 232 and output the current values to the ECM 206 via the communication link 210. The ECM 206 writes the current values in the respective memory locations.

After receiving the addresses and the values of the selected variables from the corruption testing module 208, the ECM 206 writes the values in the addressed memory locations. The control systems that utilize the selected variables may generate a response to the values written in the memory locations. The ECM 206 may transmit the response to the corruption testing module 208 via the communication link 210. The I/O module 230 receives the response and outputs the response to the response comparing module 234. The response comparing module 234 determines whether the response is within a predetermined threshold. Additionally, based on the response, the response comparing module 234 may determine an amount of time between failures and the duration of the failures.

The response comparing module 234 outputs results of the comparisons and other data related to timing of failures to the control module 222. The control module 222 determines that the memory location is defective when the response is not within the predetermined threshold. Additionally, the control module 222 formats the data received from the response comparing module 234 and generates reports based on the data. The reports may be displayed on the display (not shown) of the portable computing device 204. Alternatively, the reports may be output to a suitable output device (e.g., a printer, not shown).

Figure 4:
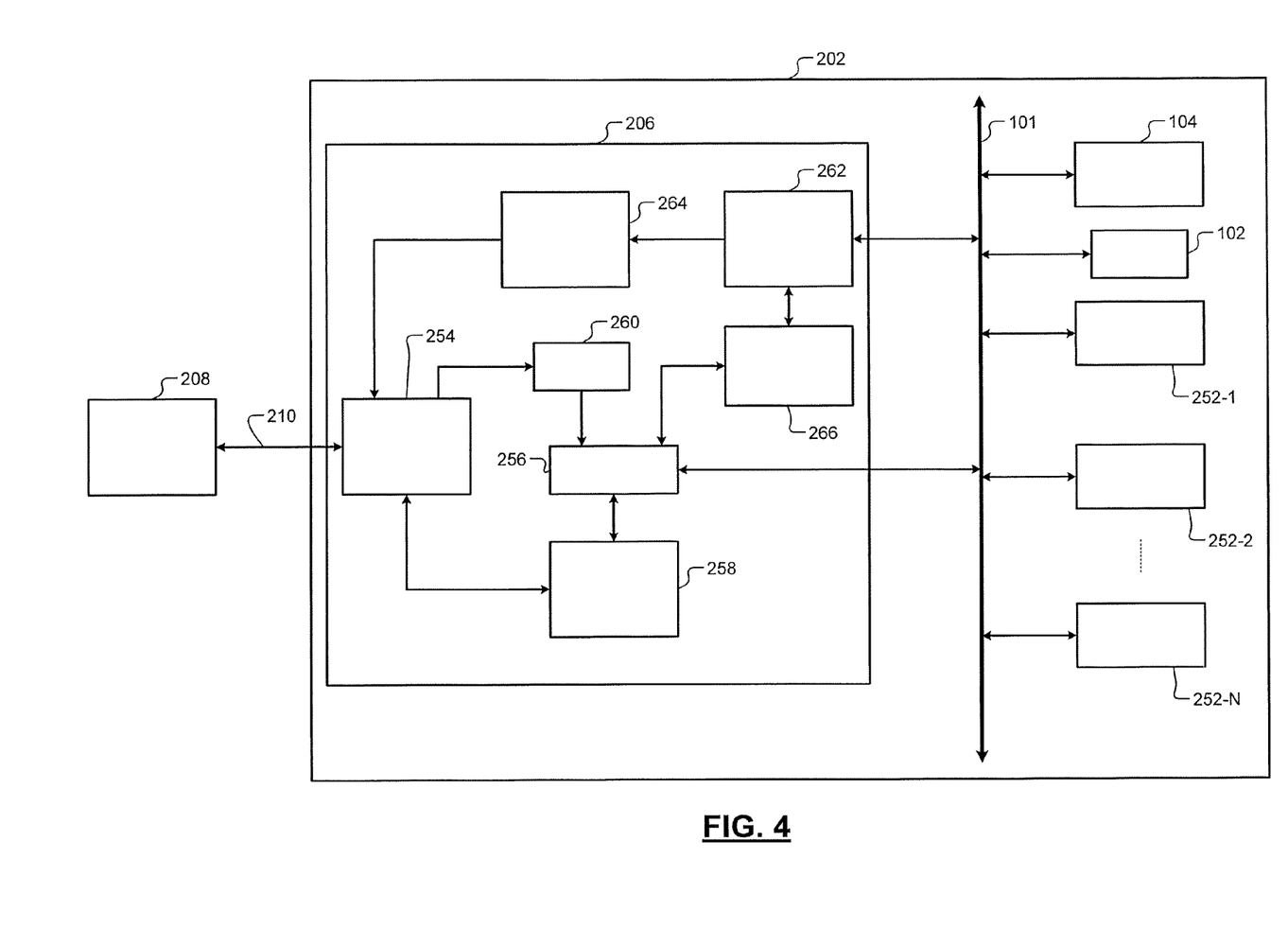
FIG. 4 is a functional block diagram of an engine control module according to the present disclosure.

Referring now to FIG. 4, a vehicle control system 250 is shown. The vehicle control system 250 comprises the engine 102, the driver input module 104, and the ECM 206. The ECM 206 controls control system 1 252-1, control system 2 252-1, ..., and control system N 252-N (collectively control systems 252), where N is an integer greater than 1. The control systems 252 may include the throttle control system 108, the brake control system 110, the transmission control system 112, and so on. The ECM 206 communicates with the engine 102, the driver input module 104, and the control systems 252 via the cable assembly 101.

The ECM 206 may comprise an I/O module 254, a memory 256, a read module 258, a write module 260, an operation sensing module 262, a response transmit module 264, and a fault identification module 266. The memory 256 stores values of the variables used by the control systems 252. The memory 256 may include rewritable memory. The memory 256 may include random access memory (RAM).

The values stored in the memory 256 may include calibrated values of the variables. The values stored in the memory 256 may change based on operations performed by the control systems 252. The operation sensing module 262 senses the operations performed by the control systems 252. Additionally or alternatively, the values stored in the memory 256 may change based on inputs received from the driver via the driver input module 104.

The fault identification module 266 validates the changes in the values stored in the memory 256 by comparing the changes to the current operating conditions, driver inputs, and/or calibrated values of the variables. When validated, the control systems 252 may use the changed values of the variables from the memory 256.

The I/O module 254 communicates with the corruption testing module 208 via the communication link 210. The I/O module 254 receives the addresses of memory locations and the values to be written in the addressed memory locations from the corruption testing module 208. The read module 258 reads the addressed memory locations and outputs the current values stored in the addressed memory locations to the I/O module 254. The I/O module 254 transmits the current values read by the read module 258 to the corruption testing module 208.

The write module 260 writes the values received from the corruption testing module 208 in the addressed memory locations. When the addressed memory locations function properly, the fault identification module 266 may determine that the values are inconsistent with the current operating conditions, driver inputs, and/or calibrated values of the variables. Accordingly, the values will not be output to the control systems 252. When the addressed memory locations are defective, however, the values written in the addressed memory locations may be output to the control systems 252.

The operation sensing module 262 senses changes in the operation of the components or subsystems controlled by the control systems 252 when the values received from the corruption testing module 208 are written in the memory 256. The response transmit module 264 transmits the changes sensed by the operation sensing module 262 to the I/O module 254. The I/O module 254 outputs the changes sensed by the operation sensing module 262 to the corruption testing module 208 via the communication link 210.

Figure 5:
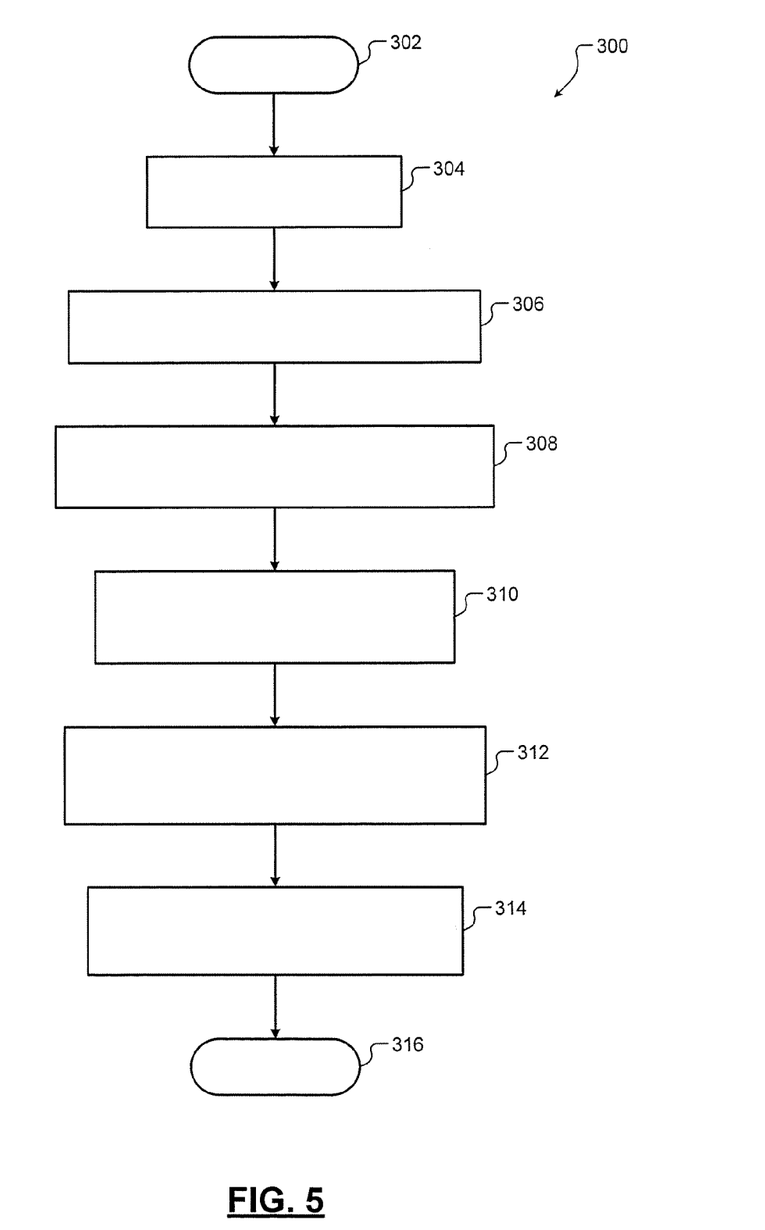
FIG. 5 is a flowchart of a method for mitigating potential hazards due to corruption in memory of an engine control module according to the present disclosure.

Referring now to FIG. 5, a flowchart of a method 300 for mitigating potential hazards due to corruption in the memory 256 is shown. The method 300 uses results generated by the corruption testing module 208 by performing corruption testing of the memory 256 as described in reference to FIGS. 2-4. For example only, the method 300 shows mitigating potential hazards in the throttle control system 108. Similar methods may be used to mitigate potential hazards in other control systems.

The method 300 begins at 302. At 304, reports generated by the corruption testing module 208 are reviewed. At 306, based on the reports, a change in the design of a component or subsystem is requested. At 308, a technical specification of the vehicle control system 202 is defined and/or updated. At 310, architecture of a control system (e.g., the throttle control system 108) is defined and/or updated.

At 312, component level requirements for the control system (e.g., the throttle control system 108) are allocated and/or refined. For example only, the component level requirements for the throttle control system 108 may include requirements related to algorithm and software for the throttle control system 108, accelerator and/or brake pedals, throttle body, wiring, and one or more controllers that control the throttle. At 314, a component rollout strategy for the throttle control system 108 is reviewed using FMEA, FTA, and so on. The method 300 ends at 316.

Figure 6:
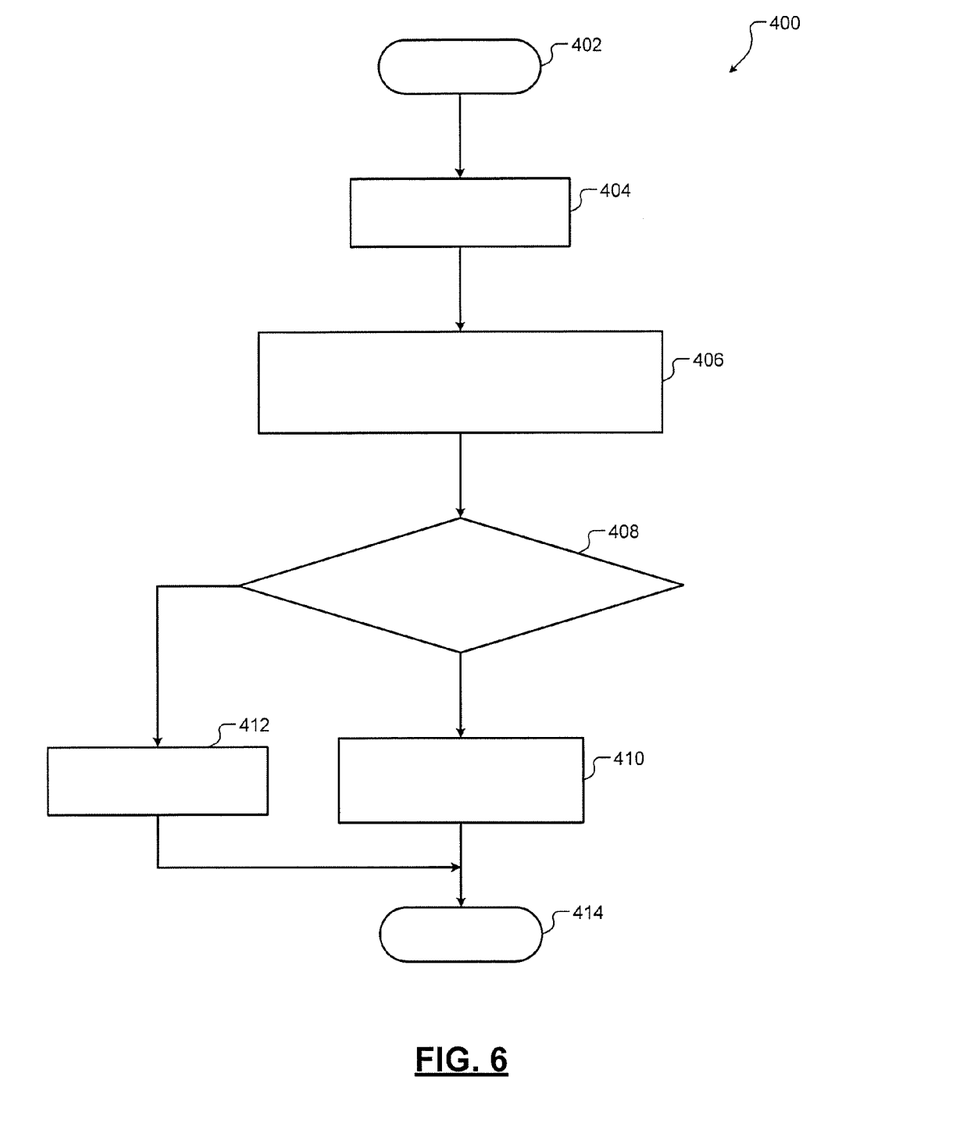
FIG. 6 is a flowchart of a method for corruption testing of memory according to the present disclosure.

Referring now to FIG. 6, a flowchart of a method 400 for corruption testing of memory according to the present disclosure is shown. Control begins at 402. At 404, control selects a variable of a control system to test. At 406, control writes a value (e.g., a maximum, minimum, and/or a median value) in a memory location where the selected variable is stored. At 408, control determines if a response of the control system to the value written in the memory location is within a predetermined threshold. At 410, when the response is not within the predetermined threshold, control generates an error message and a report. At 412, when the response is within the predetermined threshold, control indicates normal operation. Control ends at 414.

Additionally, the systems and methods for corruption testing described herein may be useful in other ways. For example, the reports generated by the corruption testing system may be used to verify the results of FTA and to identify any additional safety-critical interfaces that need to be addressed. Thus, the corruption testing system may be useful in insuring that engineers have not missed detecting and mitigating corruptions of any safety-critical interfaces. In other words, the corruption testing system may be used to validate FTA of safety-critical subsystems.

Further, the corruption testing system may be useful in fault insertion testing specified by international organization for standardization (ISO) requirement 26262. Additionally, the corruption testing system may be useful in hardware in the loop (HIL) testing.

The broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system for detecting memory corruption in an engine control module comprising:
    a variable selection module that selects a variable of a control system for testing;
    an output module that outputs a predetermined value of said variable to a memory location where said variable is stored in said engine control module;
    an input module that receives a response of said control system to said predetermined value when said predetermined value is written in said memory location; and
    a response comparing module that compares said response to a predetermined range and that determines that said memory location is defective when said response is not within said predetermined range.

2. The system of claim 1 further comprising a test value generation module that generates said predetermined value, wherein said predetermined value includes one of a maximum value, a minimum value, and a median value of said variable.

3. The system of claim 1 further comprising:
    a copy and store module that copies data stored in said memory location before said predetermined value is written in said memory location and that stores said data; and
    a restoring module that outputs said data to said memory location after said response comparing module compares said response to said predetermined range.

4. A system comprising:
    a variable selection module that selects a variable of a throttle control system for testing, wherein said throttle control system controls a throttle position based on a position of an accelerator pedal;
    an output module that outputs a predetermined value of said variable to a memory location where said variable is stored in an engine control module;
    an input module that receives a response of said throttle control system to said predetermined value when said predetermined value is written in said memory location; and
    a response comparing module that compares said response to a predetermined range and determines that said response is inconsistent with said position of said accelerator pedal when said response is not within said predetermined range.

5. An engine control module comprising:
    a write module that writes a predetermined value of a variable in a memory location where values for said variable are stored in said engine control module, wherein said values are used by a control system to control a vehicle operation; and
    an operation sensing module that senses a response of said control system to said predetermined value,
    wherein said engine control module determines that said memory location is defective when said response is not within a predetermined range.

6. The engine control module of claim 5, wherein said predetermined value includes one of a maximum value, a minimum value, and a median value for said variable.

7. The engine control module of claim 5, wherein said control system includes a throttle control system that controls a throttle position based on a position of an accelerator pedal, and wherein said engine control module determines when said response is inconsistent with said position of said accelerator pedal.

8. The engine control module of claim 5 further comprising a fault identification module that:
    identifies when said values are inconsistent with driver inputs for said control system if said memory location is not defective, and
    fails to identify that said predetermined value is inconsistent with a driver input if said memory location is defective.

9. The engine control module of claim 5 further comprising a read module that reads data stored in said memory location before said predetermined value is written, wherein said data is restored in the said memory location when said response is within a predetermined range.

10. A method for detecting memory corruption in an engine control module comprising:
    selecting a variable of a control system for testing;
    outputting a predetermined value of said variable to a memory location where said variable is stored in said engine control module;
    receiving a response of said control system to said predetermined value when said predetermined value is written in said memory location;
    comparing said response to a predetermined range; and
    determining that said memory location is defective when said response is not within said predetermined range.

11. The method of claim 10 further comprising generating said predetermined value, wherein said predetermined value includes one of a maximum value, a minimum value, and a median value of said variable.

12. The method of claim 10 further comprising:
    copying data stored in said memory location before said predetermined value is written in said memory location;
    storing said data; and
    outputting said data to said memory location after comparing said response to said predetermined range.

13. The system of claim 4 further comprising:
    a copy and store module that copies data stored in said memory location before said predetermined value is written in said memory location and that stores said data; and
    a restoring module that outputs said data to said memory location after said response comparing module compares said response to said predetermined range.

14. The system of claim 4 further comprising a fault identification module that:
    identifies when a value of said variable is inconsistent with a driver input for said throttle control system if said memory location is not defective, and
    fails to identify that said predetermined value is inconsistent with a driver input if said memory location is defective.

15. The system of claim 1 further comprising a fault identification module that:

identifies when a value of said variable is inconsistent with a driver input for said control system if said memory location is not defective, and fails to identify that said predetermined value is inconsistent with a driver input if said memory location is defective.

16. The method of claim 10 further comprising:

identifying when a value of said variable is inconsistent with a driver input for said control system if said memory location is not defective, and failing to identify that said predetermined value is inconsistent with a driver input if said memory location is defective.

* * * * *